United States Patent [19]

Lee

[11] 3,935,454

[45] Jan. 27, 1976

[54] ELECTRON COLLECTION IN ELECTRON SPECTROMETERS

[75] Inventor: Jerald Dana Lee, Wilmington, Del.

[73] Assignee: E. I. Du Pont de Nemours & Company, Wilmington, Del.

[22] Filed: June 28, 1974

[21] Appl. No.: 484,251

[52] U.S. Cl. .................................. 250/305; 250/306

[51] Int. Cl.[2] .......................................... H01J 37/26

[58] Field of Search ............ 250/305, 307, 310, 306

[56] References Cited

UNITED STATES PATENTS

| | | | |
|---|---|---|---|
| 3,710,103 | 12/1971 | Helmer | 250/49.5 AE |
| 3,731,096 | 5/1973 | Carter | 250/305 |
| 3,749,926 | 7/1973 | Lee | 250/305 |
| 3,805,068 | 4/1974 | Lee | 250/305 |

*Primary Examiner*—James W. Lawrence
*Assistant Examiner*—B. C. Anderson

[57] ABSTRACT

An electron spectrometer including a high pass filter, an electron multiplier and a reflection chamber is improved by placing a planar grid in the reflection chamber between the high pass filter and the electron multiplier.

2 Claims, 5 Drawing Figures

FIG. 1
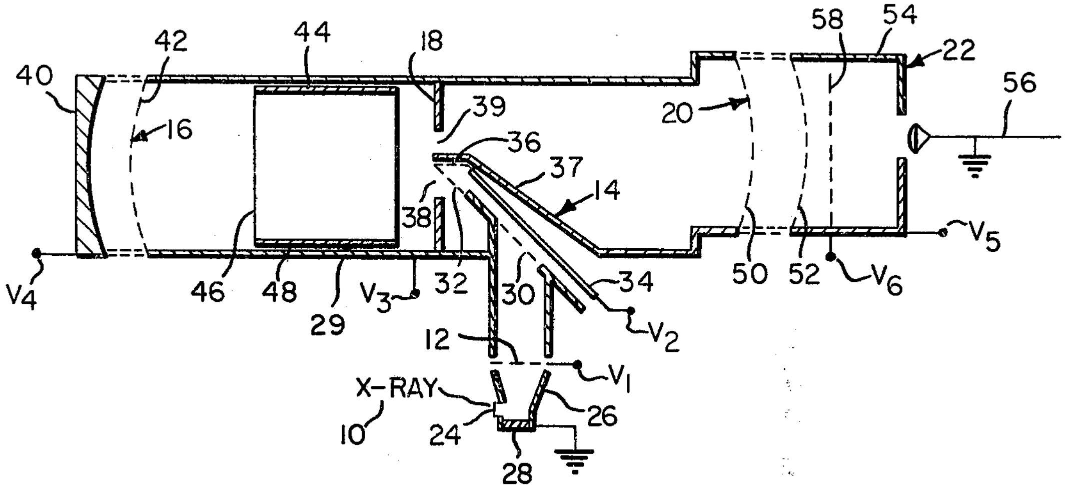
FIG. 2A (Prior art)
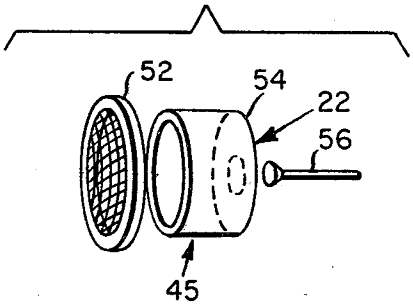
FIG. 2B
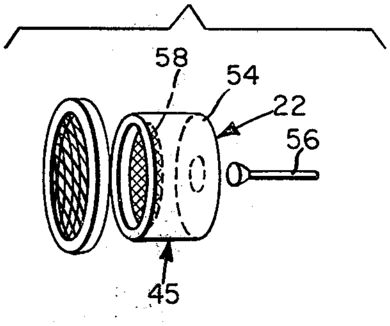
FIG. 3
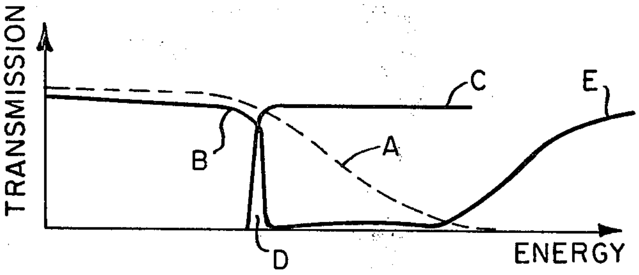
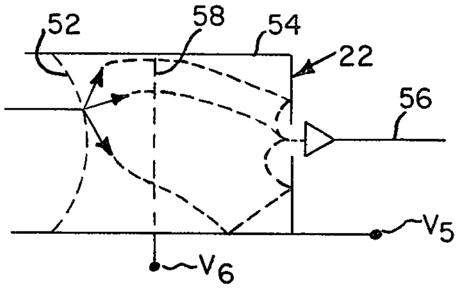
FIG. 4

ELECTRON COLLECTION IN ELECTRON SPECTROMETERS

BACKGROUND OF THE INVENTION

Field of the Invention

This invention relates to an electron spectrometer for analyzing the energy distribution of electrons having different kinetic energies. More specifically, the invention relates to an electron collector in the spectrometer which has a cylindrical reflection chamber and an electron multiplier and is improved by the addition of a positively charged planar grid in the cylindrical reflection chamber.

Prior Art and Summary

Electron spectroscopy for chemical analysis (ESCA) which is used to analyze the chemistry of surfaces is a comparatively new procedure. Briefly, it is the study of the energy distribution of secondary electrons emitted by a sample surface upon irradiation of the surface from a primary energy source such as a beam of x-rays. Electron spectrometers and more particularly spherical grid retarding potential (SGRP) analyzers have been used to collect the emitted secondary electrons because of their well known superior luminosity and throughput. One such spectrometer is described in U.S. Pat No. 3,749,926, to Lee. The spectrometer disclosed by Lee includes a reflecting low pass spherical grid filter and a retarding high pass spherical grid filter which cooperate to allow electrons in a narrow energy band to pass and a collector which receives the passed electrons. The collector is a metallic cylindrical reflection chamber which is enclosed at one end by one spherical grid of the retarding high pass filter and has a small opening in the other end with an electron multiplier adjacent to the opening which detects electrons. Electrons pass from the spherical grid into the reflection chamber at all angles. Those not directed straight at the electron multiplier strike the walls of the reflection chamber and are reflected. Of the reflected electrons some are reflected to the electron multiplier and others continue reflecting until they lose energy and are absorbed by the surface of the reflection chamber. The efficiency of the collector is not optimized because the electrons absorbed are lost and not counted.

The present invention addresses itself to this problem and provides an improvement to the collector which increases its efficiency twofold. The improvement is the addition of a positively charged planar grid inside the cylindrical reflection chamber between the spherical grid and electron multiplier. The positively charged planar grid accelerates and redirects electrons emanating from the spherical grid deeper into the reflection chamber to give them a greater statistical chance of being reflected to the electron multiplier. Since the grid is planar, it is easy to construct and inexpensive.

BRIEF DESCRIPTION OF THE DRAWINGS

FIG. 1 is a partially schematic longitudinal sectional view of apparatus for analyzing the energy distribution of electrons having different kinetic energies.

FIGS. 2A and 2B are exploded sectional views showing the prior art and improved electron collectors respectively of the apparatus of FIG. 1.

FIG. 3 is a diagrammatic illustration which shows the response curves for the prefilter, reflecting low pass filter, and retarding high pass filter of FIG. 1, together with the energy curve for secondary emission electrons from the reflecting low pass filter.

FIG. 4 is a diagrammatic view corresponding to FIG. 2B showing paths of electrons leaving the retarding spherical grid and being detected.

DESCRIPTION OF THE PREFERRED EMBODIMENTS

The principal components of the spectrometer in which the improvement of this invention has been incorporated are shown in FIG. 1. The components include x-ray source 10, electron condensing element 12, prefilter 14, reflecting low pass spherical grid filter 16, apertured metallic plate 18, retarding high pass spherical grid filter 20 and collector 22.

X-ray source 10 provides x-rays through an aluminum window 24 mounted on a tube 26 to a sample 28 mounted within tube 26 at one end. The latter tube 26 is divided into two sections one of which is grounded and the other of which is connected to a main tubular enclosure 29 which is at voltage $V_3$. Electron condensing element 12 at voltage $V_1$ is interposed between the sections and focuses electrons emitted from sample 28 to prefilter 14 lying at the open end of tube 26. Prefilter 14 is composed of an entrance grid 30 located adjacent the opening in tube 26, an exit grid 32 opening into the interior of main tubular enclosure 29, a repeller plate 34 having a voltage $V_2$, guard bars 36 having staggered intermediate potentials between $V_2$ and $V_3$, a shield 37 connected to main tubular enclosure 29. Adjacent to exit grid 32 is plate 18 which contains a semicircular entrance aperture 38 for passing electrons coming from prefilter 14 and an oppositely oriented semicircular exit aperture 39 which passes electrons reflected from reflecting low pass filter 16. The latter reflecting low pass filter 16 is composed of a concave spherical aluminum element 40 having a voltage $V_4$ and a spherical grid 42 which is connected to main tubular enclosure 29. Between plate 18 and reflecting low pass filter 16 is a conventional quadrupole lens 44 made up of a pair of vertical arcuate plates 46 and a pair of horizontal arcuate plates 48 which serve to a lign the reflected electrons for passage through the semicircular exit aperture 39 in plate 18.

At the opposite end of main tubular enclosure 29 is retarding high pass filter 20 which is composed of spherical grids 50 and 52. The end of main tubular enclosure 29 is slightly offset such that the exit aperture 39 in plate 18 serves as the center of the radius of curvature of spherical grids 50 and 52. Spherical grid 50 is connected to main tubular enclosure 29 and spherical grid 52 encloses one end of metallic cylindrical reflection chamber 54 which is at voltage $V_5$. Reflection chamber 54 is one component of collector 22 which also includes electron multiplier 56 and the planar grid 58 of this invention. The end of reflection chamber 54 not enclosed by spherical grid 52 has a small opening which electron multiplier 56 lies adjacent to. Electron multiplier 56 is grounded. Planar grid 58 is fabricated from wire mesh and is located between spherical grid 52 and electron multiplier 56 and is at voltage $V_6$.

FIG. 2A shows the structural details of spherical grid 52 and collector 22 of the prior art. FIG. 2B shows the improvement to collector 22 which is the addition of planar grid 58.

FIG. 3 shows a graph with the kinetic energy of electrons plotted as a function of amount of transmission. Curves A, B, C on the graph are the response curves for prefilter 14, reflecting low pass filter 16 and retarding high pass filter 20 respectively. The overlapping portion of curves B and C, area D, represents a narrow band of electrons which are passed by both the reflecting low pass filter 16 and the retarding high pass filter 20. Curve E is the energy curve for secondary emission electrons emitted from reflecting low pass filter 16.

FIG. 4 illustrates the paths of electrons leaving spherical grid 52 at all angles, the latter electrons being either detected directly by electron multiplier 56 or being reflected from the sides of reflection chamber 54 and then detected by electron multiplier 56.

In operation, x-rays from source 10 are directed through window 24 to sample 28 which is grounded causing a beam of electrons of different kinetic energies to be emitted from the sample. The beam of electrons passes along tube 26 and is focused by electron condensing element 12, at 0 V to −1200 V along the second section of tube 26 to entrance grid 30 of prefilter 14. The second section of tube 26 and main tubular enclosure 29 are at $V_3$, which is a selectable voltage between −200V and −1200V. The level of the voltage selected determines the kinetic energy of electrons leaving sample 28 which the spectrometer will detect. The selected kinetic energy level may be chosen from a wide spectrum of kinetic energy levels at which the spectrometer is capable of collecting electrons. During a single measurement the spectrometer will normally sweep through all of the kinetic energy levels to give an electron collection reading for each level. All other voltages in the spectrometer are measured with respect to $V_3$. Prefilter 14 is a low pass filter which passes all electrons below a specified energy level as illustrated in curve A of FIG. 3 and rejects all those above the level. The reason for having prefilter 14 will be examined in detail hereinafter. The electron beam entering prefilter 14 is incident on a deflecting electric field set up by repeller grid 34 negatively charged to $V_2$, which is −53 V with respect to $V_3$. The electrons below the cut off level of curve A cf FIG. 3 are deflected through an angle of approximately 90° and pass through the exit grid 32. The electrons above the cut off level have enough energy to penetrate through the field and are absorbed by repeller plate 34 or guard bars 36 and are lost from the electron beam.

The electron beam leaving exit grid 32 passes through semi-circular entrance aperture 38 of plate 18 and is dispersed over the entire area of reflecting low pass filter 16. Concave spherical aluminum element 40 of reflecting low pass filter 16 is negatively charged to $V_4$, which is −75V with respect to $V_3$, while spherical grid 42 is at $V_3$, thus creating an electrical field which acts as a low pass energy filter which reflects electrons below a specified energy level back toward retarding high pass filter 20. Those electrons in the beam having energies above the specified level pass through the electric field and are absorbed by aluminum element 40 and are lost from the beam. Curve B of FIG. 3 illustrates the response of reflecting low pass filter 16. The latter reflecting low pass filter 16, since it is spherical, focuses the reflected electron beam to exit aperture 39 in plate 18. Additionally, quadrupole lens 44 aids in positioning the reflected electron beam to exit aperture 39. The electron beam passes through aperture 39 and is dispersed over the entire area of retarding high pass filter 20. Spherical grid 52 is negatively charged to $V_5$ which is −74.8V with respect to spherical grid 50 which is at $V_3$, thereby creating an electric field which is a retarding field. Only those electrons having an energy greater than a predetermined energy cutoff level will pass through the electric field to collector 22. Those having less energy are reflected and are lost. Curve C of FIG. 3 illustrates the response of retarding high pass filter 20.

In FIG. 3 the cut off energy level for reflecting low pass filter 16 shown in curve B is slightly greater than the cut off energy level for retarding high pass filter 20 shown in Curve C. The overlapping area D of the two curves represents a narrow energy band of electrons which are passed by both filters to collector 22. It is to be noted that curve A of FIG. 3 which illustrates the response of prefilter 14 has a cutoff higher than overlapping area D and eliminates secondary emission electrons created from high energy electrons striking aluminum element 40 as shown in curve E.

The electrons leaving spherical grid 52 of retarding high pass filter 20 leave at all angles as shown in FIG. 4 and those leaving tangentially would normally have less of a chance to be detected than those directed straight at electron multiplier 56. Planar grid 58 which is the subject of the present invention corrects this by redirecting and accelerating the tangentially directed electrons deeper into reflection chamber 54 where they stand a better chance of detection. To accomplish this, planar grid 58 which is at $V_6$, −55V with respect to $V_3$, creates an accelerating electric field between itself and spherical grid 52 which is at $V_5$, −75V with respect to $V_3$. The electric field redirects and accelerates the electrons deeper into reflection chamber 54 where a small positive electric field created by electron multiplier 56 either directly attracts the electrons or attracts them after they are reflected from the sides of reflection chamber 54. The reflection chamber 54 is essentially field free except for the fields created by planar grid 58 and electron multiplier 56. Planar grid 58 has in addition to its accelerating field a decelarating field which it creates with reflection chamber 54.

The spectrometer may be used for example to analyze the surface of a fluoropolymer and the change that occurs to the surface when it is treated with a solution of sodium in ammonia. The untreated surface when analyzed exhibits peaks of kinetic energy at 297 eV and 697 eV which indicate that high energy type carbon and fluorine are present in the surface. After the surface is treated the peaks indicating the presence of the high energy type carbon and fluorine disappear and new peaks appear at 285 eV, 287 eV, 289 eV and 535 eV which indicate that the surface contains hydrocarbons of the carbonyl and carboxyl type groups. Apparently the chemical effect of the treatment of the surface is to convert the fluorocarbon surface to a partially oxidized hydrocarbon surface. The analyzer provides means for establishing a chemical explanation of why this treatment effectively increases the surface energy and promotes adhesion to fluoropolymer surfaces.

The present invention has been described in a preferred embodiment but it will be clear to those skilled in the art that modifications and variations of this invention are possible within the teaching of this disclosure. All such modifications and variations are intended to be within the scope of the appended claims.

I claim:

1. In apparatus for analyzing the energy distributor of electrons, said apparatus including an electron collector providing an otherwise field free region for the collection and detection of electrons, a source of electrons to be analyzed, a low pass filter for directing a selected portion of said electrons having kinetic energies below a first level toward said collector, and a high pass filter, having an exit electrical potential, for passing those of said electrons having a kinetic energy exceeding a second level less than said first level interposed between said low pass filter and said collector, said collector being a tubular, metallic reflecting chamber having an exit opening with an electron detector positioned thereat, the improvement wherein:

a grid is positioned within said chamber between said detector and said high pass filter at a higher electrical potential than said chamber, thereby to provide both accelerating and decelerating fields for said electrons.

2. The apparatus set forth in claim 1 wherein said grid is planar.

* * * * *